United States Patent
Lien et al.

(10) Patent No.: US 7,941,723 B1
(45) Date of Patent: May 10, 2011

(54) CLOCK GENERATOR AND METHOD FOR PROVIDING RELIABLE CLOCK SIGNAL USING ARRAY OF MEMS RESONATORS

(75) Inventors: Chuen-Der Lien, Los Altos Hills, CA (US); Jimmy Lee, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 595 days.

(21) Appl. No.: 11/861,869

(22) Filed: Sep. 26, 2007

(51) Int. Cl.
*G01R 31/3181* (2006.01)
*G01R 31/40* (2006.01)

(52) U.S. Cl. .......................... 714/744; 714/742

(58) Field of Classification Search .............. None
See application file for complete search history.

(56) References Cited

U.S. PATENT DOCUMENTS

| | | | | |
|---|---|---|---|---|
| 5,289,138 | A * | 2/1994 | Wang | 331/49 |
| 5,838,692 | A * | 11/1998 | Tobin | 714/724 |
| 6,065,029 | A * | 5/2000 | Weiss | 708/251 |
| 6,788,161 | B2 * | 9/2004 | Vilander | 331/185 |
| 6,909,221 | B2 | 6/2005 | Ayazi et al. | |
| 7,365,614 | B2 * | 4/2008 | McCorquodale et al. | 331/179 |

OTHER PUBLICATIONS

Krishnakumar Sundaresan, "Temperature Compensated CMOS and MEMS-CMOS Oscillators for Clock Generators and Frequency References," Georgia Institute of Technology, Dec. 2006.

Farrokh Ayazi, "Silicon Bulk Acoustic Wave Resonators," Integrated MEMS Laboratory, Georgia Institute of Technology, Jul. 17, 2007.
Soumik Ghosh and Magdy Bayoumi, "On Integrated CMOS-MEMS System-on-Chip" The 3rd International IEEE-NEWCAS Conference, Jun. 19-22, 2005, pp. 31-34.
Kurt E. Peterson, "Silicon as a Mechanical Material," Proceedings of the IEEE, vol. 70, No. 5, May 1982.
Wan-Thai Hsu, Ph.D., "From Micromechanical Resonators to Fully Integrated Transceivers.".

* cited by examiner

*Primary Examiner* — Cynthia Britt
*Assistant Examiner* — Dipakkumar Gandhi
(74) *Attorney, Agent, or Firm* — Kenneth Glass; Glass & Associates

(57) ABSTRACT

A clock generator is disclosed that includes an array of MEMS resonators and a test circuit. The test circuit is operable at start-up to operate one or more of the MEMS resonators to generate test output and analyze the test output to determine whether the operated MEMS resonators meet test criteria. A MEMS resonator is selected that meets the test criteria and its output is used to generate an output clock signal. In addition, the test circuit is operable to analyze the output of the selected MEMS resonator and select a replacement MEMS resonator when the output of the selected MEMS resonator no longer meets the test criteria. The replacement MEMS resonator is then operated and its output is coupled to the output of the clock generator. Thereby, failing and potentially failing MEMS resonators are automatically replaced during operation of the clock generator in its end-use application.

20 Claims, 9 Drawing Sheets

CLOCK GENERATOR AND METHOD FOR PROVIDING RELIABLE CLOCK SIGNAL USING ARRAY OF MEMS RESONATORS

BACKGROUND

Micro Electro Mechanical Systems (MEMS) resonators have been developed that can provide accurate clocking signals. However, the industry has been slow to adopt clock generators that include MEMS resonators because of uncertainty regarding reliability. Some of the uncertainty can be reduced by increased in-production and post-production testing. However, it is well known that failures in new products are often only discovered later in the life of a device, long after manufacture and initial testing. Such failures can sometimes be detected after installation but usually require that the appliance or system in which a device operates is taken out of operation for testing.

When a system fails as a result of a failure of a complex semiconductor device in it, Built-in Self Test (BIST), usually exercised at power-up, can be used to locate the failed device for replacement. However, the locating and replacing do not take place until the system fails, incurring the cost and inconvenience of a system shutdown.

In light of the above, a need exists for a MEMS clock generator that generates a reliable clock signal. A further need exists for a method for generating a reliable clock signal using an array of MEMS resonators. The method and apparatus of the present invention meets the above needs.

SUMMARY

The present invention provides a method and apparatus in which MEMS resonators in an array of MEMS resonators are tested at start-up and a MEMS resonator that meets the test criteria is selected to provide output for generating the output clock signal. The selected MEMS resonator is also tested during operation of the clock generator. When the selected MEMS resonator fails to meet the test criteria it is replaced by a MEMS resonator that meets the test criteria.

A clock generator is disclosed having an array of MEMS resonators formed on an integrated circuit die, a test circuit and a control circuit. The control circuit includes a drive circuit for operating the MEMS resonators in the array. A switch is electrically coupled to the control circuit, the output of each MEMS resonator coupled to an input of the switch and an output of the switch electrically coupled to an output of the clock generator. The test circuit is operable at start-up to operate one or more of the MEMS resonators to generate test output and analyze the test output to determine whether the operated MEMS resonators meet test criteria. The test circuit is further operable to control the operation of the switch so as to couple the output from the selected MEMS resonator to the output of the clock generator for generating an output clock signal. In addition, the test circuit is operable after start-up to analyze the output of the selected MEMS resonator and couple the output of a replacement MEMS resonator that meets the test criteria to the output of the clock circuit when the output of the selected MEMS resonator no longer meets the test criteria.

A method for generating a reliable clock signal is disclosed in which one or more MEMS resonators in an array of MEMS resonators are operated at start-up to generate test output. The test output is analyzed to determine whether the operated MEMS resonators meet test criteria. When one or more of the MEMS resonators meets the test criteria, one of the MEMS resonators is selected that meets the test criteria. This selected MEMS resonator is operated and the output from the selected MEMS resonator is coupled to the output of the clock generator for generating an output clock signal. During operation of the selected MEMS resonator, one or more of the non-selected MEMS resonators are operated to generate additional test output which is analyzed to determine the non-selected MEMS resonators that meet the test criteria. After coupling the output from the selected MEMS resonator to the output of the clock generator and during operation of the selected MEMS resonator, the output from the selected MEMS resonator is analyzed to determine whether the output of the selected MEMS resonator meets the test criteria. If the selected MEMS resonator does not meet the test criteria, a replacement MEMS resonator is selected from the non-selected MEMS resonators that were determined to meet the test criteria, the replacement MEMS resonator is operated and the output from the replacement MEMS resonator is coupled to the output of the clock generator.

The method and apparatus of the present invention repeatedly tests the selected MEMS resonator during operation of the clock generator in its end-use application and automatically replaces the selected MEMS resonator when it no longer meets test criteria. Thereby, continuous operation of the clock generator is assured, providing a MEMS clock generator that provides a reliable clock signal and eliminating the need to take the clock generator offline for testing or replacement. Moreover, reliability is further improved by testing non-selected MEMS resonators during operation of the clock generator, assuring that the replacement MEMS resonator will function properly.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits will not be described in detail so as to avoid obscuring aspects of the present invention. At times, concepts disclosed in this discussion of embodiments of the present invention will be made more readily apparent by reference to the Figures.

Figure 1:
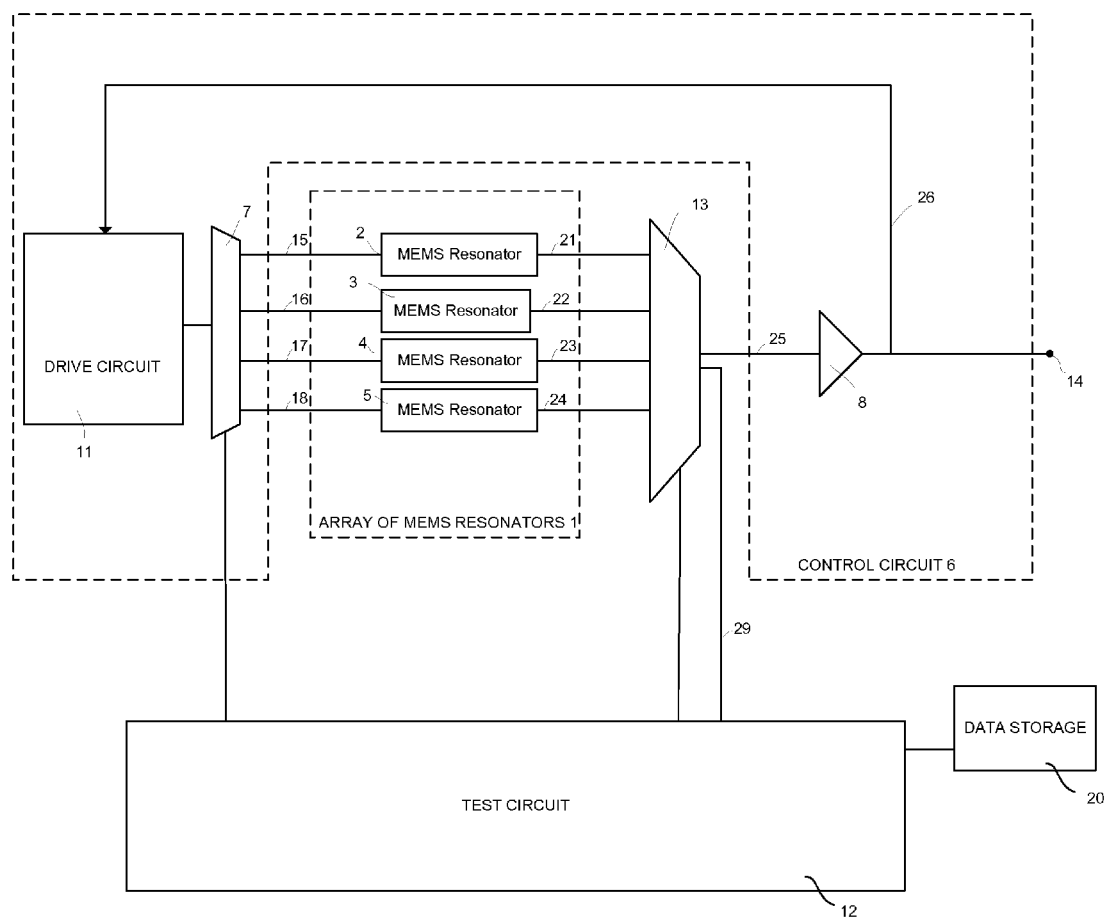
FIG. 1 is a block diagram of a clock generator having an array of MEMS resonators, in accordance with an embodiment of the present invention.

Referring now to FIG. 1 a clock generator 10 is shown in accordance with an embodiment of the present invention. Clock generator 10 has an array of MEMS resonators 1 that includes MEMS resonators 2-5. It is appreciated that array of MEMS resonators 1 can have more or fewer MEMS resonators. Clock generator 10 includes control circuit 6, test circuit 12, switch 13 and data storage 20. Control circuit 6 is electrically coupled to array of MEMS resonators 1, and includes all circuitry necessary to operate the MEMS resonators 2-5 and generate an output clock signal 14. In the present embodiment, control circuit 6 includes drive circuit 11 that provides input for operating MEMS resonators 2-5 and switch 7 that is connected to the output of drive circuit 11. Switch 7 is connected to MEMS resonators 2-5 as shown by lines 15-18 and is operable to connect drive circuit 11 to a single MEMS resonator in array of MEMS resonators 1 for operating the MEMS resonator. Control circuit 6 also includes amplifier 8 and feedback loop 26.

Switch 13 is connected to the output of each of the MEMS resonators 2-5 in MEMS resonator array 1. More particularly, line 21 connects MEMS resonator 2 to switch 13, line 22 connects MEMS resonator 3 to switch 13, line 23 connects MEMS resonator 4 to switch 13 and line 24 connects MEMS resonator 5 to switch 13. One output of switch 13 is connected to amplifier 8 and the other output is connected to test circuit 12.

Test circuit 12 includes logic for testing MEMS resonators 2-5. Test circuit 12 is connected to switch 7 and can control the operation of switch 7 for selecting a particular MEMS resonator 2-5 to be operated. In addition test circuit 12 is connected to switch 13 such that that test circuit 12 can control the operation of switch 13.

In the present embodiment switch 13 is a multiplexer that is coupled to receive the output from each of MEMS resonators 2-5 and provide the output selected by test circuit 12 to either test circuit 12, or to both test circuit 12 and amplifier 8. However, switch 13 can be any circuit or device that allows for coupling a single one of a plurality of inputs to to one or both of two outputs. In one embodiment switch 13 includes one or more MEMS switch.

Figure 2:
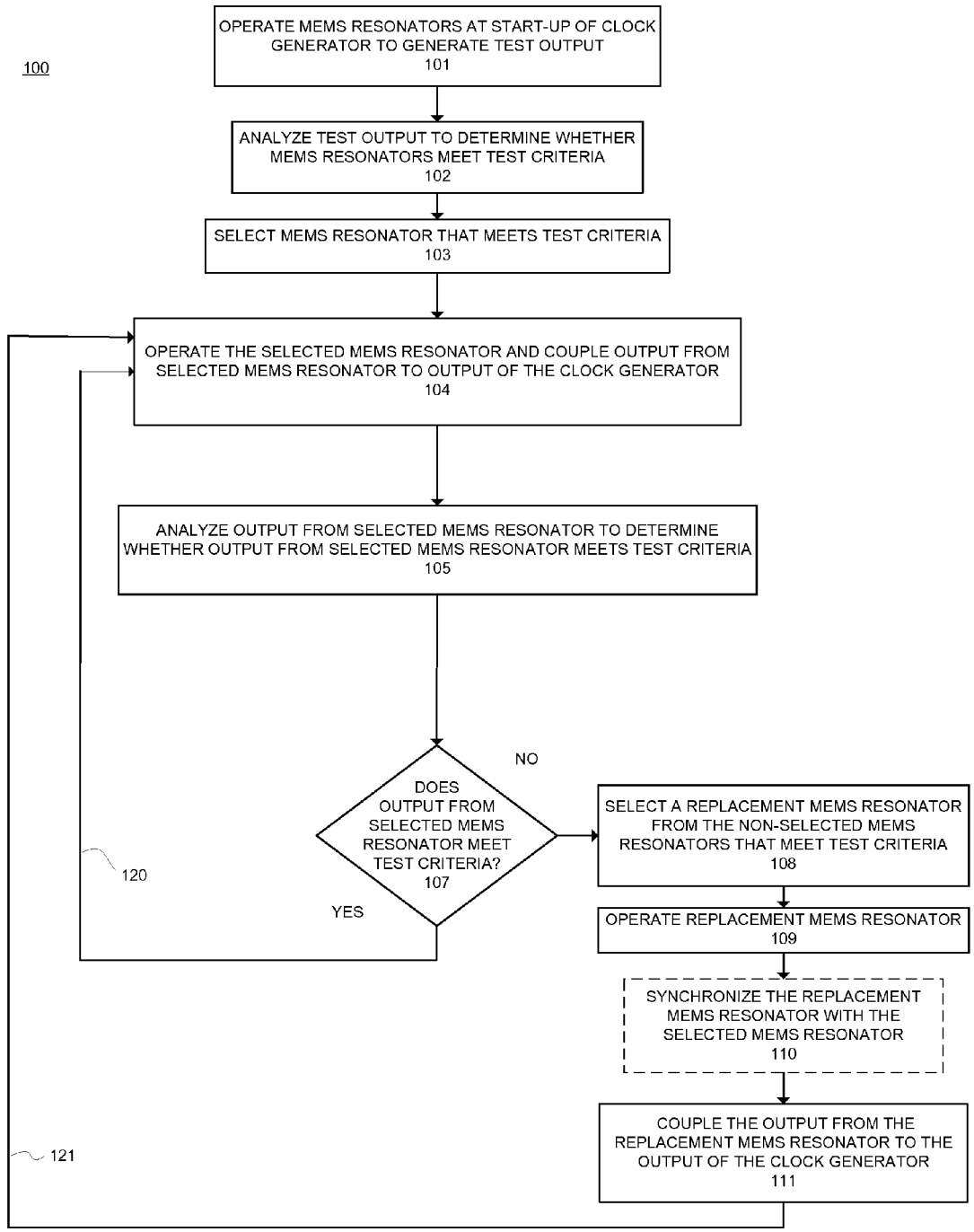
FIG. 2 is a flow chart of a method for generating a reliable clock signal using an array of MEMS resonators, in accordance with an embodiment of the present invention.

FIG. 2 illustrates a method 100 for preventing failure of a clock generator that includes an array of MEMS resonators. Referring now to step 101 the MEMS resonators are operated at start-up of the clock generator to generate test output.

Referring now to step 102 the test output is analyzed to determine whether MEMS resonators meet test criteria. In one embodiment MEMS resonators in the array are operated sequentially, with each MEMS resonator operated (step 101) and the generated test output analyzed (step 102) to determine whether the operated MEMS resonators meet test criteria.

In one embodiment step 102 analyzes the test output to determine inductance (L), capacitance (C) and impedance (R) of the tested MEMS resonator. In this embodiment the test criteria includes an inductance tolerance ($L_T$), an impedance tolerance ($R_T$) and a capacitance tolerance ($C_T$). The determined L, R and C are then compared to their tolerances $L_T$, $R_T$ and $C_T$, respectively, to determine whether the calculated L, R and C values exceed their tolerance. In one embodiment, if any of the calculated L, R or C values exceed their tolerance, the tested MEMS is determined not to meet the test criteria. In one specific embodiment the $L_T$, $R_T$ and $C_T$ are each set at plus or minus one percent of target L, R and C levels. In another embodiment, tolerance levels $L_T$, $R_T$ and $C_T$ are programmable such that they can be tailored to the end-use of the clock generator.

In the embodiment shown in FIG. 1, at start-up, switch 7 provides input from drive circuit 11 to a single one of MEMS resonators 2-5 to operate the MEMS resonator 2-5 to be tested. A test voltage $V_T$ is applied to the operated MEMS resonator 2-5 and the test output from the operated MEMS resonator 2-5 is analyzed by test circuit 12. During the start-up process test circuit 12 controls the selection of MEMS resonators, sequentially operating each of MEMS resonators 2-5 to generate test output which is analyzed in step 102. In the present embodiment the test output is analyzed by test circuit 12, generating test data that is saved in data storage 20.

For example, when MEMS resonator 2 is to be tested, at step 101 test circuit 12 provides input to switch 7 such that drive circuit 11 is coupled to MEMS resonator 2, initiating oscillation of MEMS resonator 2. The output of MEMS resonator 2 is coupled to switch 13 by line 21. Test circuit 12 provides input to switch 13 such that the input from line 21 is provided only to output 29, coupling the output of MEMS resonator 2 to test circuit 12. Since the output of switch 13 is not provided to line 25, the output of MEMS resonator 2 will not be provided to amplifier 8. Accordingly, the output of MEMS resonator 2 will not be provided to the output 14 of clock generator 10. In step 102, test circuit 12 is operable to determine L, R and C for MEMS resonator 2 and the determined L, R and C are stored as test data in data storage device 20. Test circuit 12 is also operable to determine whether the output of MEMS resonator 2 meets the test criteria. Once test circuit 12 determines whether MEMS resonator 2 meets the output criteria a flag is set in data storage device 20 that indicates the result of the analysis. In the present embodiment a first flag is set if the L of MEMS resonator 2 meets $L_T$, a second flag is set if the R of MEMS resonator 2 meets the $R_T$, and a third flag is set if the C of MEMS resonator 2 meets $C_T$. Alternatively a single flag can be used, with the single flag set if the determined L, R and C from MEMS resonator 2 all meet their tolerances. This process is then repeated for each of the remaining MEMS resonators 3-5.

Referring now to step 103 a MEMS resonator that meets the test criteria is selected. As shown by step 104, the selected MEMS resonator is operated and the output from the selected MEMS resonator is coupled to the output of the clock generator. More particularly, once a MEMS resonator is selected, if it is operating at the time of the selection its operation is continued and its output is coupled to the output of the clock generator. If it is not operating at the time of its selection, operation of the selected MEMS resonator is initiated and is coupled to the output of the clock generator.

In the embodiment shown in FIG. 1 the selection is made by test circuit 12. More particularly, test circuit 12 provides input to switch 7 such that drive circuit 11 initiates operation of the selected MEMS resonator 2-5. Test circuit 12 provides input to switch 13 such that the output of the selected MEMS resonator is provided both to line 25 and line 29, coupling the output of the selected MEMS resonator to output 14 of the clock generator 10 and to test circuit 12. Steps 101-104 complete the start-up sequence and normal operation of the clock generator begins. The array of MEMS resonators will now have only one operating MEMS resonator (the selected MEMS resonator) and none of the other MEMS resonators in the array (the non-selected MEMS resonators) will be operating at this time. The output of the selected MEMS resonator is used to generate the clock signal output from the clock generator.

As shown by step 105, the output from the selected MEMS resonator is tested during operation of the selected MEMS resonator to generate the output clock signal. More particularly, the output from the selected MEMS resonator is analyzed to determine whether the output from the selected MEMS resonator meets test criteria. In the present embodiment step 105 is performed periodically during the operation of the clock generator, repeatedly testing the selected MEMS resonator while the selected MEMS resonator is being used to generate the output clock signal. In one embodiment, in step 105, test circuit 12 analyzes the output of the selected MEMS resonator to determine inductance (L), capacitance (C) and impedance (R) of the selected MEMS resonator. In this embodiment the test criteria includes an inductance tolerance ($L_T$), an impedance tolerance ($R_T$) and a capacitance tolerance ($C_T$). The determined L, R and C are then compared to their tolerances $L_T$, $R_T$, and $C_T$, respectively, to determine whether the calculated L, R and C values exceed their tolerance. In one embodiment, if any of the calculated L, R or C values exceed their tolerance, the tested MEMS is determined not to meet the test criteria.

When, for example, MEMS resonator 2 is the selected MEMS resonator, the output of selected MEMS resonator 2 is coupled to test circuit 12 by line 29. In step 105, test circuit 12 is operable to determine L, R and C for selected MEMS resonator 2 and the determined L, R and C are stored as test data in data storage 20. Test circuit 12 is then operable to determine whether the output of MEMS resonator 2 meets the test criteria. Once test circuit 12 determines whether MEMS resonator 2 meets the output criteria one or more flag is set in data storage device 20 that indicates the result of the analysis. In the present embodiment a first flag is set if the L of MEMS resonator 2 meets $L_T$, a second flag is set if the R of MEMS resonator 2 meets $R_T$, and a third flag is set if the C of MEMS resonator 2 meets $C_T$. Alternatively a single flag can be used, with the single flag set if the determined L, R and C from MEMS resonator 2 all meet their respective tolerances.

Referring now to step 107 if analysis of the output from the selected MEMS resonator in step 105 indicates that the selected MEMS resonator does meet the test criteria, operation of the clock generator continues as shown by line 120. However, if the analysis of step 105 indicates that the output does not meet the test criteria, the selected MEMS resonator is replaced by a MEMS resonator that does meet the test criteria as shown by steps 107-111. More particularly, referring to step 108, a replacement MEMS resonator is selected from the non-selected MEMS resonators that were determined to meet the test criteria. In the present embodiment the replacement MEMS resonator is selected from the non-selected MEMS resonators that were determined in step 102 to meet the test criteria.

As shown by step 109 the replacement MEMS resonator is operated. As shown by step 111, the output of the replacement MEMS resonator is coupled to the output of the clock generator. Referring to optional step 110, the replacement MEMS resonator can be synchronized to the selected MEMS resonator prior to coupling the output of the replacement MEMS resonator to the output of the clock generator. In the embodiment shown in FIG. 1, steps 108-109 are performed by test circuit 12 and there is no synchronization (step 110). More particularly, test circuit 12 selects a replacement MEMS resonator from the non-selected MEMS resonators that meet test criteria and test circuit 12 provides input to switch 7 such that the replacement MEMS resonator is operated. Test circuit 12 then provides input to switch 13 such that the output of the replacement MEMS resonator is provided to amplifier 8 and to test circuit 12. Since the output of amplifier 8 connects to output 14 of the clock generator 10 an output clock signal will be coupled to output 14.

After the replacement of steps 107-111 the selected MEMS resonator is no longer operated, leaving only the replacement MEMS resonator operating. The operation of the clock generator continues as shown by line 121, with the output of the replacement MEMS resonator coupled to output of the clock generator 14 for generating the output clock signal. The method then continues, with the replacement MEMS resonator becoming the selected MEMS resonator for the purposes of steps 104-111. Accordingly, subsequent replacements can be made each time that a selected MEMS resonator fails to meet test criteria in step 105, continuing operation of the clock generator as long as there are available MEMS resonators that meet test criteria.

When more than one MEMS resonator meets the test criteria, in one embodiment the stored test data is used to determine which of the tested MEMS resonators is the best MEMS resonator and the determined best MEMS resonator is selected in step 103. Alternatively, the selected MEMS resonator is chosen by default, selecting the last-selected MEMS resonator that meets test criteria. Similarly, when multiple MEMS resonators meet test criteria in step 108, the chosen replacement MEMS resonator can be the best MEMS resonator or can be chosen by default to be the most recently used non-selected MEMS resonator that meets test criteria.

By repeatedly testing the selected clock generator during operation of the clock generator and automatically replacing the selected clock generator when it no longer meets test criteria, continuous and uninterrupted operation of the clock generator is obtained.

In one embodiment each of MEMS resonators 2-5 is a Silicon Bulk Acoustic Resonator (SiBAR) that vibrates in the plane of the substrate. In one embodiment a three-mask HARPSS-on-SOI fabrication process is used to form each of MEMS resonators 2-5. Alternatively, other fabrication processes known in the art can be used to form MEMS resonators 2-5. MEMS resonators 2-5 can be capacitive MEMS resonators or piezoelectric MEMS resonators. Moreover, MEMS resonators 2-5 can any type of MEMS resonator, including but not limited to comb-drive, CC-beam, FF-beam, square-frame, disk/wineglass, ring/square AlN or extended wineglass resonators.

Figure 3:
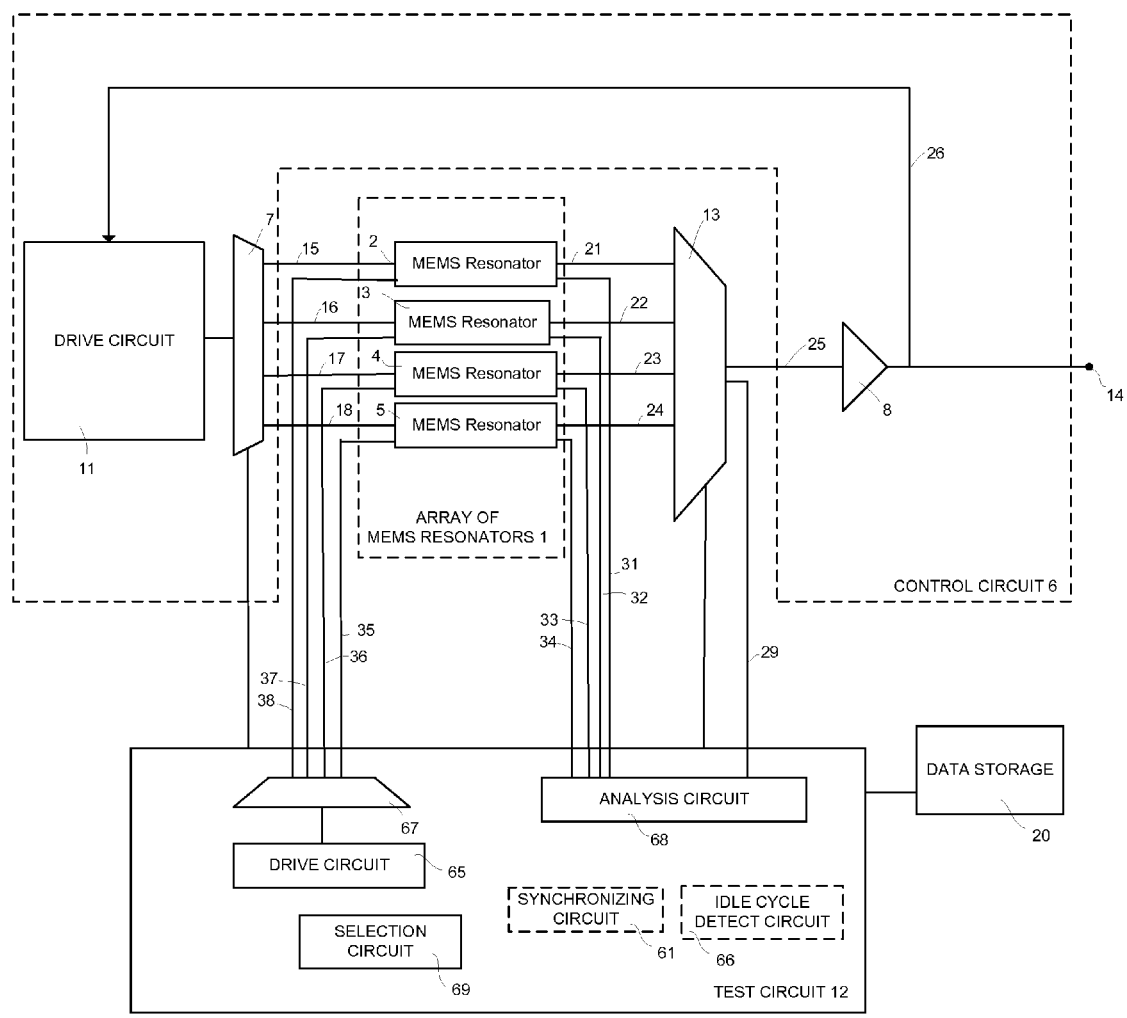
FIG. 3 is a block diagram of a clock generator that includes an array of MEMS resonators and a test circuit that includes a second drive circuit, in accordance with an embodiment of the present invention.

FIG. 3 shows an embodiment in which test circuit 12 includes an additional drive circuit 65 that operates independently of drive circuit 11. Drive circuit 65 is coupled to a switch 67 that couples to each of MEMS resonators 2-5 as shown by lines 35-38. In operation, drive circuit 65 provides a single output to switch 67 and switch 67 provides the output of drive circuit 65 to a single one of MEMS resonators 2-5 for selectively oscillating MEMS resonators 2-5.

Test circuit 12 includes analysis circuit 68 that couples to the output of each of MEMS resonators 2-5 as shown by lines 31-34. In the present embodiment analysis circuit 68 includes circuits for determining L, R and C, and circuits for determining whether the determined L, R and C values meet the test criteria. In one embodiment $L_T$, $R_T$ and $C_T$ values are stored in data storage 20 and analysis circuit 68 is operable to determine whether the determined L, R and C values exceed the stored $L_T$, $R_T$ and $C_T$ values.

Test circuit 12 also includes optional synchronizing circuit 61, optional idle cycle detect circuit 66 and selection circuit 69. Synchronizing circuit 61 includes circuitry for synchronizing a replacement MEMS resonator with a selected MEMS resonator and idle cycle detect circuit 66 includes circuitry for identifying idle cycles. Selection circuit 69 is electrically coupled to analysis circuit 68 and is operable to control the selection of switches 7, 13 and 67.

When the clock generator 10a of FIG. 3 is used for performing method 100, either drive circuit 11 or drive circuit 65 can operate individual MEMS resonators during start-up testing (steps 101-102). In this embodiment analysis circuit 68 analyzes the test output in step 102, indicating to selection circuit 69 the selected MEMS resonator. In step 104, selection circuit 69 provides input to switch 7 to couple drive circuit 11 to the selected MEMS resonator and provides input to switch 13 to provide the output of the selected MEMS resonator to line 25 and line 29 to generate a clock signal at output 14.

Continuing with method 100, in one embodiment steps 101-102 are only performed until a MEMS resonator is determined to meet the test criteria. This first MEMS resonator that is determined to meet the test criteria is selected. In this embodiment steps 101 and 102 are performed concurrently, with analysis of test data for a MEMS resonator occurring during the operation of that MEMS resonator. When a MEMS resonator is found to meet the test criteria, the operation of the selected MEMS resonator is continued and its output is coupled to the output of the clock generator. This provides for fast start-up since the selected MEMS resonator is already operating. In this embodiment, start-up time is reduced since there is no need to operate all of the MEMS resonators in the array prior to start-up.

Figure 4:
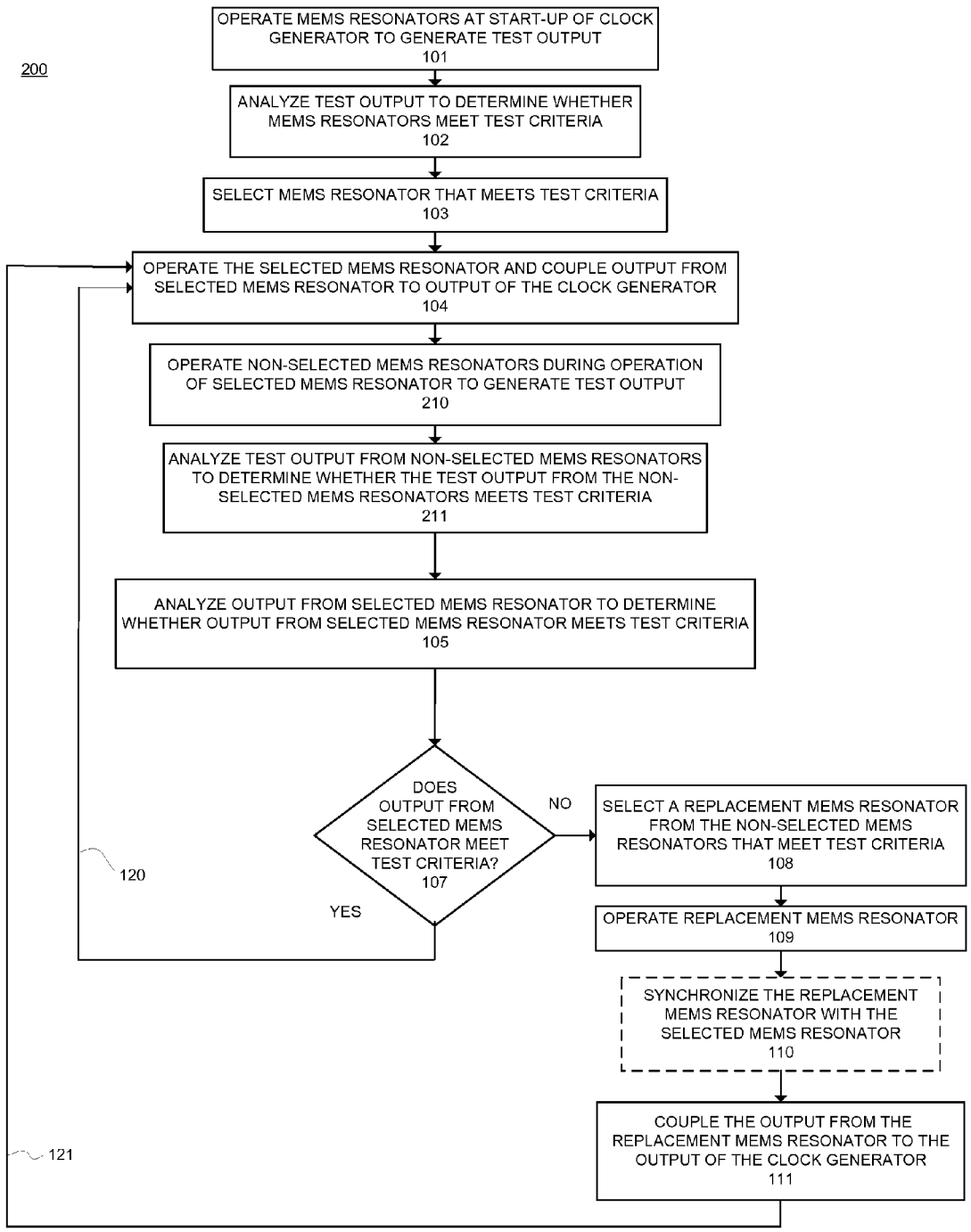
FIG. 4 is a flow chart of a method for generating a reliable clock signal using an array of MEMS resonators, where non-selected MEMS resonators are operated at the same time as the selected MEMS resonator, in accordance with an embodiment of the present invention.

Referring now to FIG. 4 a method 200 is illustrated in which the non-selected MEMS resonators are operated to generate test output and the output is analyzed while the selected MEMS resonator is being used to generate clock output. More particularly, after start-up and during normal operation of the clock generator, the non-selected MEMS resonators are operated as shown by step 210 to generate additional test output. Then, as shown by step 211, the test output from the MEMS resonators operated in step 210 is analyzed to determine whether the output of the non-selected MEMS resonators meet the test criteria.

Steps 210-211 are performed concurrently with step 104, while the selected MEMS resonator is generating the output clock signal. In the present embodiment each of the non-selected MEMS resonators are operated and their test output is analyzed sequentially, until all non-selected MEMS resonators have been tested. The analysis of step 105 can be performed concurrently with steps 210-211. The testing and analysis of steps 210-211 and 105 can be performed continually, periodically or the testing can be programmable by the end user, allowing for tailoring of the testing process to the end-use application.

In one embodiment control circuit 10a of FIG. 3 is used to perform method 200. In this embodiment drive circuit 65 is operable in step 210 to operate non-selected MEMS resonators 2-5 while drive circuit 11 operates the selected MEMS resonator 2-5. Since a separate drive circuit 65 is used for testing non-selected MEMS resonators 2-5 and since the output of the non-selected MEMS resonators 2-5 is not coupled to the output of the clock circuit, the testing of steps 210-211 will not affect the normal operation of the clock generator.

For example, when MEMS resonator 5 is the selected MEMS resonator, at step 210 selection circuit 69 provides input to switch 67 such that the output of drive circuit 65 is coupled to MEMS resonator 2, initiating oscillation of MEMS resonator 2. Since MEMS resonator 2 is not the selected MEMS resonator, switch 13 will not provide the output of MEMS resonator 2 to line 25 and line 29. Accordingly, the output of MEMS resonator 2 will not be coupled to output 14 of clock generator 10a. In one embodiment a test voltage $V_T$ is provided to the input of MEMS resonator 2 through line 38 and the output of MEMS resonator 2 is coupled to analysis circuit 68 by line 31. In step 211 analysis circuit 68 is operable to determine L, R and C for MEMS resonator 2 and the determined L, R and C are stored in data storage 20. Analysis circuit 68 is also operable to determine whether the output of MEMS resonator 2 meets the test criteria. Once test circuit 12 determines whether MEMS resonator 2 meets the test criteria a flag is set in data storage device 20 that indicates the result of the analysis. In the present embodiment a first flag is set if the L of MEMS resonator 2 meets $L_T$, a second flag is set if the R of MEMS resonator 2 meets the $R_T$, and a third flag is set if the C of MEMS resonator 2 meets $C_T$. Alternatively a single flag can be used, with the single flag set if the determined L, R and C from MEMS resonator 2 all meet their tolerances. This process is then repeated for each of the remaining non-selected MEMS resonators 3-4.

The method then continues as shown by steps 105, 107 and line 120, with continued operation using the selected MEMS resonator as long as the analysis of step 105 indicates that the test data from the selected MEMS resonator meets test criteria. As in method 100, if output from the selected MEMS resonator does not meet the test criteria the selected MEMS is replaced by a MEMS that does meet the test criteria as shown by steps 107-111. More particularly, referring to step 108, a replacement MEMS resonator is selected from the non-selected MEMS resonators that were determined to meet the test criteria. However, since additional testing is done in steps 210 and 211, the replacement MEMS resonator can either be a non-selected MEMS resonator that was determined to meet the test criteria in step 102 and/or a non-selected MEMS resonator that was determined to meet the test criteria in step 211.

In the embodiment shown in FIG. 3 Drive circuit 65 can power the replacement MEMS resonator. In this embodiment at step 109, selection circuit 69 provides input to switch 67 such that the output of drive circuit 65 is applied to the input of the replacement MEMS resonator, initiating oscillation of the replacement MEMS resonator. Synchronizing circuit 61 is then used to synchronize the output of the replacement MEMS resonator with the selected MEMS resonator and selection circuit 69 provides input to switch 13 such that switch 13 provides the output of the replacement MEMS resonator to lines 25 and 29, coupling the output of the replacement MEMS resonator to output 14 of the clock circuit. After the replacement of steps 108-111 operation of the selected MEMS resonator is ceased, leaving only the replacement MEMS resonator operating. The operation of the clock generator continues as shown by line 121, with the output of the replacement MEMS resonator coupled to the clock output. The method then continues, with the replacement MEMS resonator becoming the selected MEMS resonator for the purposes of steps 104-111 and 210-211. Accordingly, subsequent replacements can be made each time that a selected MEMS resonator fails to meet test criteria in step 105, continuing operation of the clock generator as long as there are available MEMS resonators that meet test criteria.

Method 200 adds operation and testing of non-selected MEMS resonators during normal operation of the clock generator using the selected clock generator. During the testing of steps 210-211, the output of the tested MEMS resonators is not coupled to the output of the clock circuit. Accordingly, the test process of steps 210-211 will not affect the normal operation of the clock generator as the clock generator will be functioning using the output from the selected clock generator. The additional testing of method 200 assures that there are available non-selected MEMS resonators that can be selected for replacement and that will correctly operate, further assuring continuous and uninterrupted operation of the clock generator.

Figure 7:
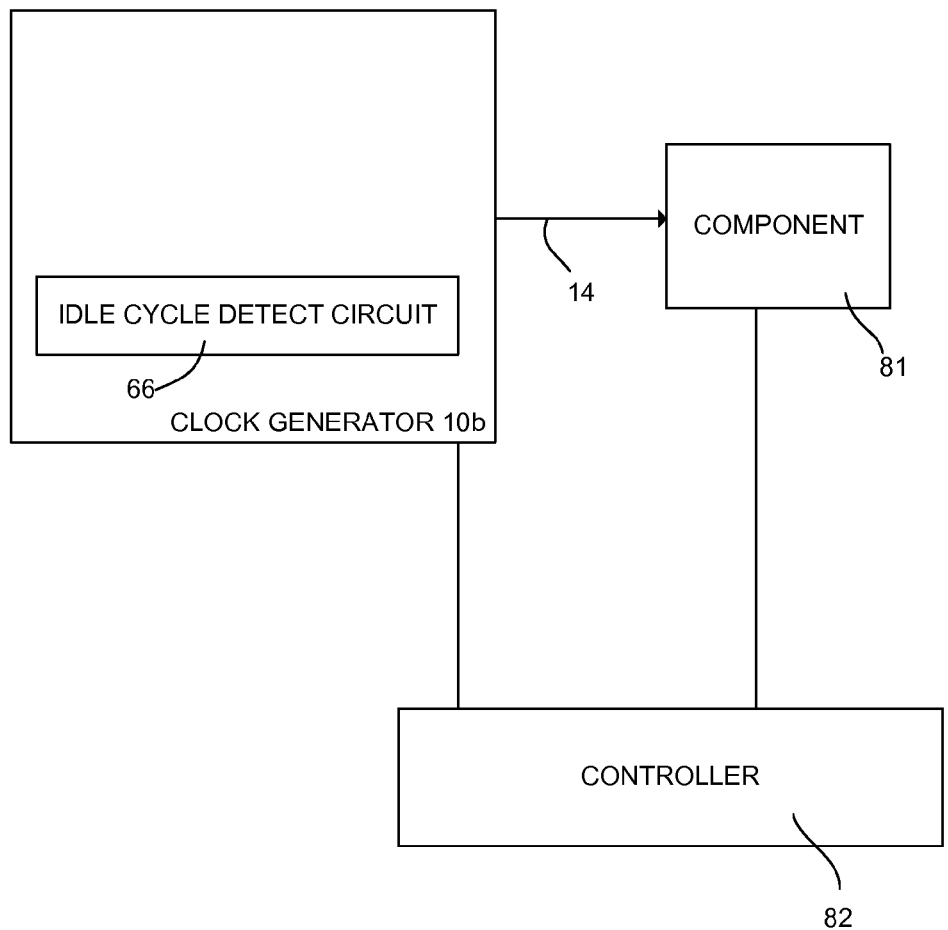
FIG. 7 is a block diagram of an integrated circuit device that includes a clock generator and a component, where the output clock signal from the clock generator is provided to the component for operating the component, in accordance with an embodiment of the present invention.

FIG. 7 shows an exemplary integrated circuit device 80 that includes a clock generator 10b, a component 81 and a controller 82. In this embodiment controller 82 is electrically coupled to clock generator 10b and component 81, and controls the operation of integrated circuit device 80. Clock generator 10b provides a clock signal to component 81. Component 81 uses the clock signal to perform one or more functions in the normal operation of integrated circuit device 80. In one embodiment of the present invention, integrated circuit device 80 is a system-on-chip (SOC). In addition, integrated circuit device 80 can be a static random access memory (SRAM) device, a dynamic random access memory (DRAM) device, a first-in first out (FIFO) device, a multi-port device, a content addressable memory (CAM) device, or any other type of integrated circuit device that includes a clock generator 10b for generating a clock signal that is utilized during the normal operation of the integrated circuit device 80. In one embodiment integrated circuit device 80 is a single semiconductor die. However, alternatively, integrated circuit device 80 can include multiple semiconductor die that are electrically coupled together such as, for example, a multi-chip module that is packaged in a single integrated circuit package. In yet another embodiment clock generator 10b is a first semiconductor die and component 81 is a second semiconductor die that are electrically coupled together by, for example, a circuit board.

In most integrated circuit devices, a specific component is actually active for only a part of the operating time of the integrated circuit device, and enters an active cycle only when called upon by some other element such as, for example, a controller. Those operational periods in which a functional element is not in an active cycle, referred to hereinafter as "idle cycles," can be identified in any of a number of different ways, depending on the architecture of the integrated circuit device. In an embodiment when a functional element select line is used to activate a component the functional element is determined to be in an idle cycle when the functional element select line is not selected.

At times during operation of integrated circuit device 80, component 81 is in an active cycle and at other times component 81 is in an idle cycle. In the present embodiment clock generator 10b includes idle cycle detect circuit 66 that is operable to detect these idle cycles. In one embodiment controller 82 is operable to indicate to idle cycle detect circuit 66 idle cycles of component 81.

Figure 5:
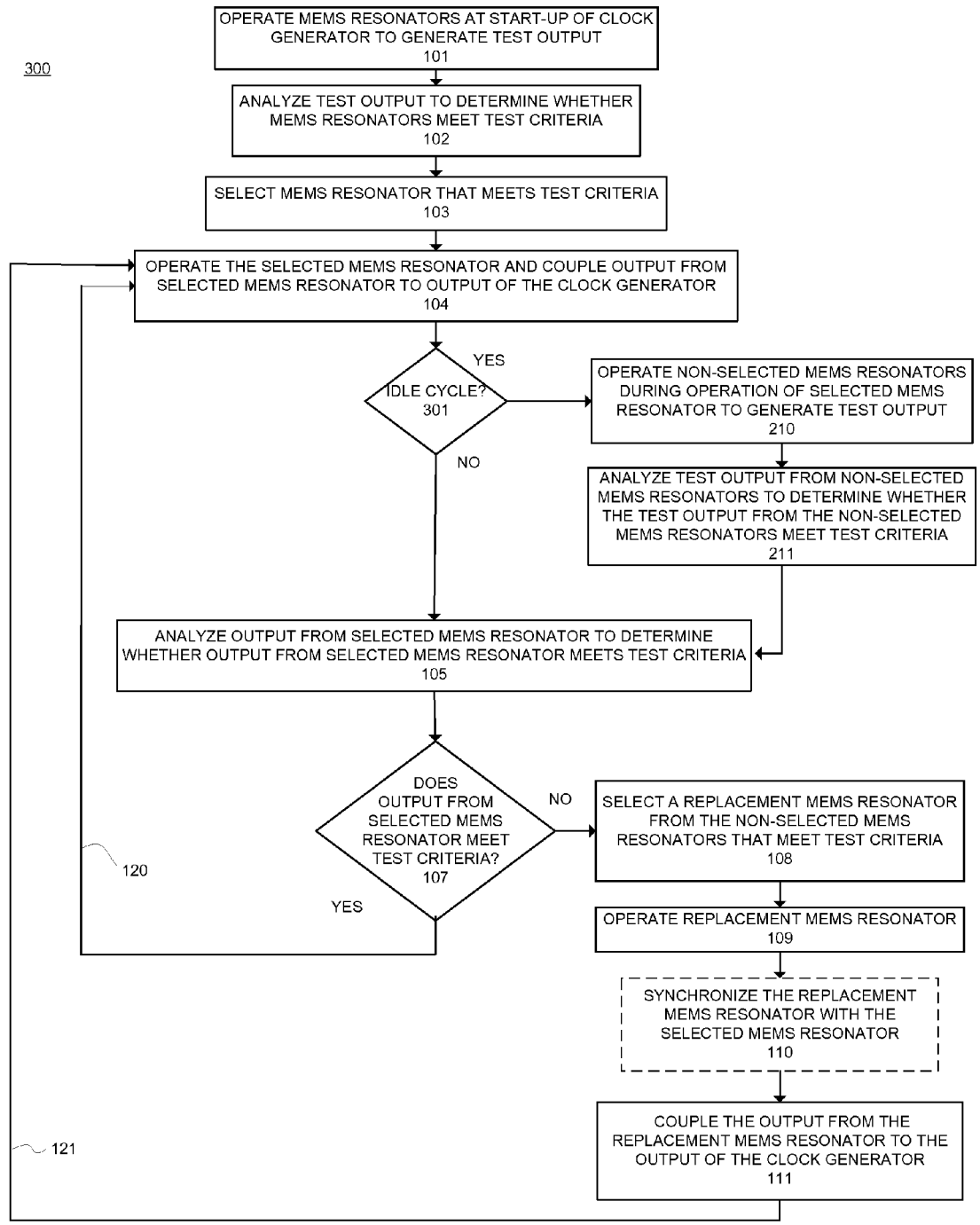
FIG. 5 is a flow chart of a method for generating a reliable clock signal using an array of MEMS resonators, where non-selected MEMS resonators are operated only during idle cycles, in accordance with an embodiment of the present invention.

In one embodiment that is illustrated in method 300 of FIG. 5, the testing of steps 210-211 is performed only during idle cycles of the integrated circuit device. More particularly, step 301 determines whether the component(s) that utilize the clock signal from the clock generator is in an idle cycle. In the embodiment shown in FIG. 7, idle cycle detect circuit 66 determines when component 81 is in an idle cycle. As in method 200, oscillation of the selected MEMS resonator is maintained during steps 210-211, assuring that operation of integrated circuit device 80 is not affected by the testing of steps 210-211. By performing steps 210-211 only during idle cycles, any interference that could result from simultaneously operating and testing non-selected MEMS resonators in the array is prevented. This further assures that steps 210-211 will not adversely affect the operation of integrated circuit device 80.

In the present embodiment the testing of steps 210-211 continues as long as component 81 is in an idle cycle, stopping when the functional element is no longer in an idle cycle. In one embodiment testing of non-selected MEMS resonators is sequential, with testing reinitiated each time that a new idle cycle is detected, starting with the next MEMS resonator in the array that has not yet been tested and continuing until all non-selected MEMS resonators in the array have been tested. In one embodiment, after the initial test of all of the non-selected MEMS resonators in the array, the testing of steps 210-211 is repeated periodically, at time intervals programmable by the end user.

It is appreciated that more than one component can utilize the clock signal from the clock generator. When more than one component is utilizing the clock signal from the clock generator an idle cycle is determined to occur when all of the components that utilize the clock signal from the clock generator are in an idle cycle.

Figure 6:
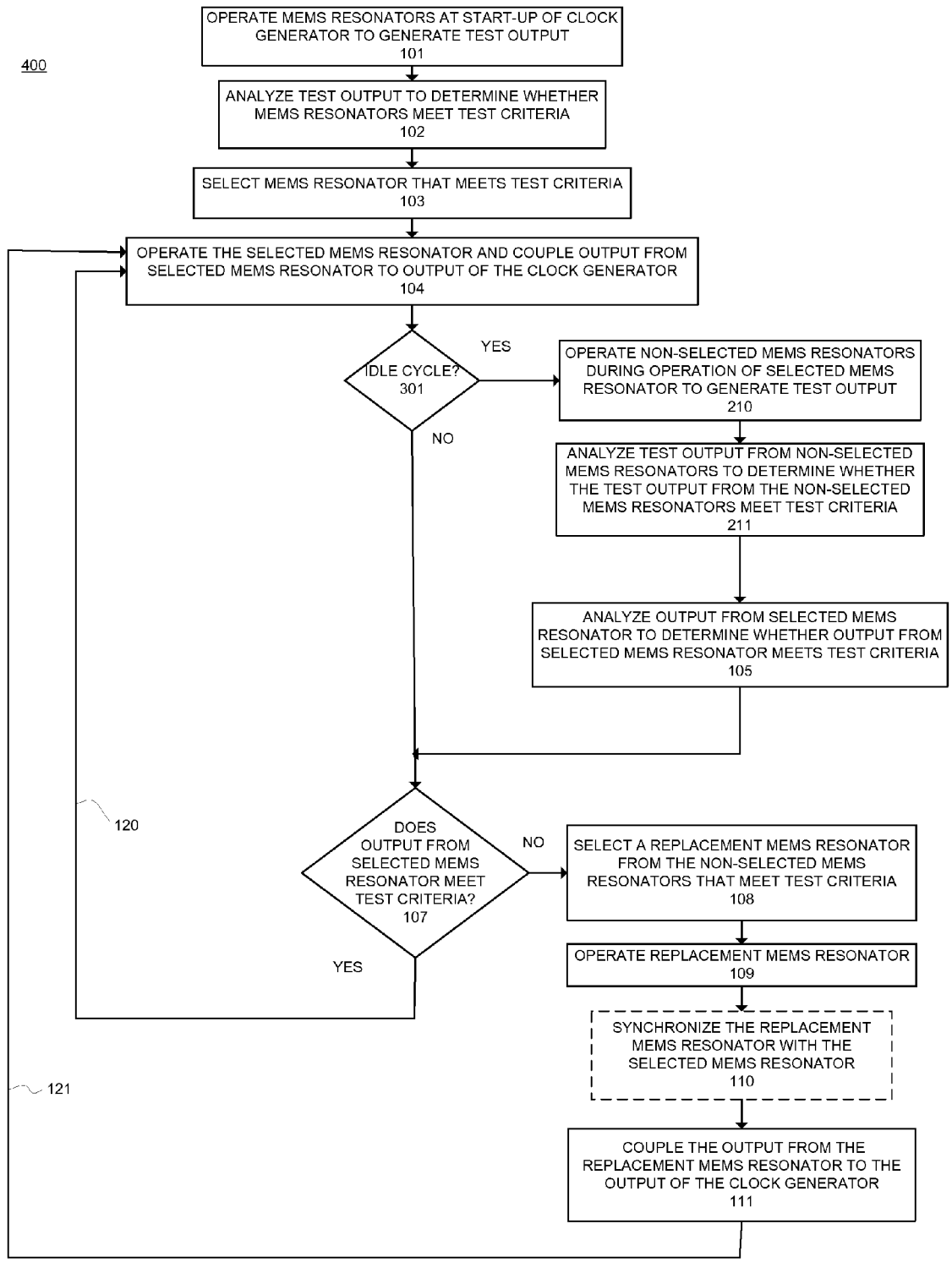
FIG. 6 is a flow chart of a method for generating a reliable clock signal using an array of MEMS resonators, where non-selected MEMS resonators are operated only during idle cycles and where test output from operation of the selected MEMS resonator is analyzed only during idle cycles, in accordance with an embodiment of the present invention.

In one embodiment that is illustrated in method 400 of FIG. 6, the testing of steps 210-211 and the analysis of output from the selected MEMS resonators in step 105 are performed only during idle cycles of the integrated circuit device. By performing steps 210-211 and 105 only during idle cycles, any interference that could result from simultaneously operating nearby MEMS resonators in the array and from the testing of step 105 is prevented. This further assures that steps 210-211 and 105 will not adversely affect the normal operation of the integrated circuit device.

In the embodiments shown in FIGS. 4-6, oscillation of the selected MEMS resonator is maintained during steps 210-211, continuing normal operation of integrated circuit device 80 during the testing of steps 210-211. However, operation and testing of steps 210-211 can introduce vibration-related error into the output clock signal. Accordingly, to minimize this error, in one embodiment each MEMS resonator 2-5 is isolated using trench isolation. More particularly, trenches are formed that surround each individual MEMS resonator 2-5. These trenches are filled with a dielectric material such as a bulk oxide (e.g., a high-density plasma oxide) that will absorb the vibration, eliminating vibration-induced error that can occur as a result of simultaneous operation of multiple MEMS resonators 2-5.

In one embodiment, test circuit 12 monitors the number of good MEMS resonators and sends an error signal when the number of known good MEMS resonators falls to a predetermined level. Thereby, the system administrators will know that a replacement needs to be made soon, allowing them to schedule the needed replacement and perform it during routine system maintenance. Thereby, unscheduled downtime is avoided.

In the present embodiment, methods 100, 200, 300 and 400 are performed on an integrated circuit device by internal circuitry of that integrated circuit device during operation of the integrated circuit device in its end-use application. More particularly, methods 100, 200, 300 and 400 are not performed during testing of an integrated circuit device on a burn-in board or other testing apparatus, but rather are performed after the integrated circuit device has shipped to an end-use customer and has been incorporated into an end-use computing system and during operation. The end-use computing system may be, for example, a high-speed router in a large, high-traffic, local area network (LAN). The router, and the LAN, must continue to function in order to ensure the continued operation and reliability of the LAN. Embodiments of the present invention are enabled to test the MEMS resonators of the integrated circuit devices in such critical systems, under extreme operating conditions, without incurring the onus of having to take the systems, or their component appliances, offline to accommodate the testing. Embodiments of the present invention can predict failure in integrated circuit devices included in such critical computing systems without interruption of their end uses.

It is noted that the integrated circuit device can be any type of semiconductor device such as a complex memory, complex programmable logic device (CPLD), field-programmable gate array (FPGA), or other complex device in which the clock generator is implemented. A functional element of an integrated circuit device can be segment of memory, a logic gate array, or some other element or group of elements in a complex array of functional elements.

Methods 200, 300 and 400 provide for testing of non-selected MEMS resonators while the selected MEMS resonator is operating in its end-use environment to generate an output clock signal, enabling recurring automated testing of MEMS resonators to ascertain whether a MEMS resonator is becoming a potentially failing element and automated replacement of potentially failing MEMS resonators, without having to take the integrated circuit device or the clock generator off line. Moreover, the integrated circuit device and/or the clock generator does not have to be powered down and powered back up, or be placed in a dedicated test mode.

The testing of steps 101, 102, 105 and 210-211 can test any of a number of different parameters of each MEMS resonator 2-5 and any of a number of different test criteria can be used to identify failing MEMS resonators and/or potentially failing MEMS resonators. Though the embodiments of methods 100-400 are discussed as including calculations of L, R and C and comparing the calculated values to tolerances, it is appreciated that, alternatively, other tests could be used.

In one embodiment, since the selected MEMS resonator is being used to generate clock output, other criteria are also used in step 105. In one embodiment, the frequency of the output clock signal is determined and the analysis of step 105 includes determining whether the frequency (f) of the output clock signal is within a certain tolerance. In one embodiment the frequency tolerance ($f_T$) is set at one hundred parts per million relative to a target frequency. Alternatively, the frequency tolerance is programmable, allowing for tailoring the operation of the clock generator to the end-use application.

In one embodiment the testing of steps 101-102 and 210-211 includes testing of each MEMS resonator at different voltage levels $V_T$. The results of each test are stored in persistent memory storage 20. In one embodiment temperature ($T_T$) and frequency ($F_T$) are determined by test circuit 12 for each $V_T$ that is tested and are stored along with the other test results. In one embodiment the stored $V_T$, $T_T$, $F_T$ are used by the circuitry of control circuit 6 to more accurately compensate for temperature variation when a particular MEMS resonator is used, providing improved-temperature compensation that is specific to the characteristics of each MEMS resonator. In addition, in embodiments in which a bias voltage is applied to operate MEMS resonators 2-5, the MEMS resonators are tested at different $V_{BIAS}$ levels, the results are stored and are used along with the stored $V_T$, $T_T$, $F_T$ to more accurately compensate for temperature variation.

In one embodiment the testing of steps 101-102 and 210-211 includes voltage margin testing. Voltage margin testing subjects the tested MEMS resonator to a $V_{BIAS}$ and/or $V_T$ that is higher or lower than the normal supplied voltage. In one embodiment, lower voltage is supplied to the MEMS resonator being tested. In another embodiment, a higher than normal voltage is supplied for the test. By subjecting the non-selected MEMS resonators to a voltage that higher or lower than normal, the function of the MEMS resonators is examined at the margins of its specified operating capability. It is noted that a MEMS resonator element can fail a test at the margin of operation even though it is operating normally at voltages in the middle of the operating specification, or envelope. If such a failure occurs it is highly probable that the element's performance is in the process of degrading and that a failure will occur while operating within the specified operating envelope. Accordingly, by using a margining voltage, methods 100, 200, 300 and 400 can determine if such failure is going to occur and can identify or flag the element as a potentially failing element prior to failure of the element during operation. Moreover, the test criteria can be set such that the potentially failing MEMS resonator is replaced prior to its actual failure during operation.

Figure 8:
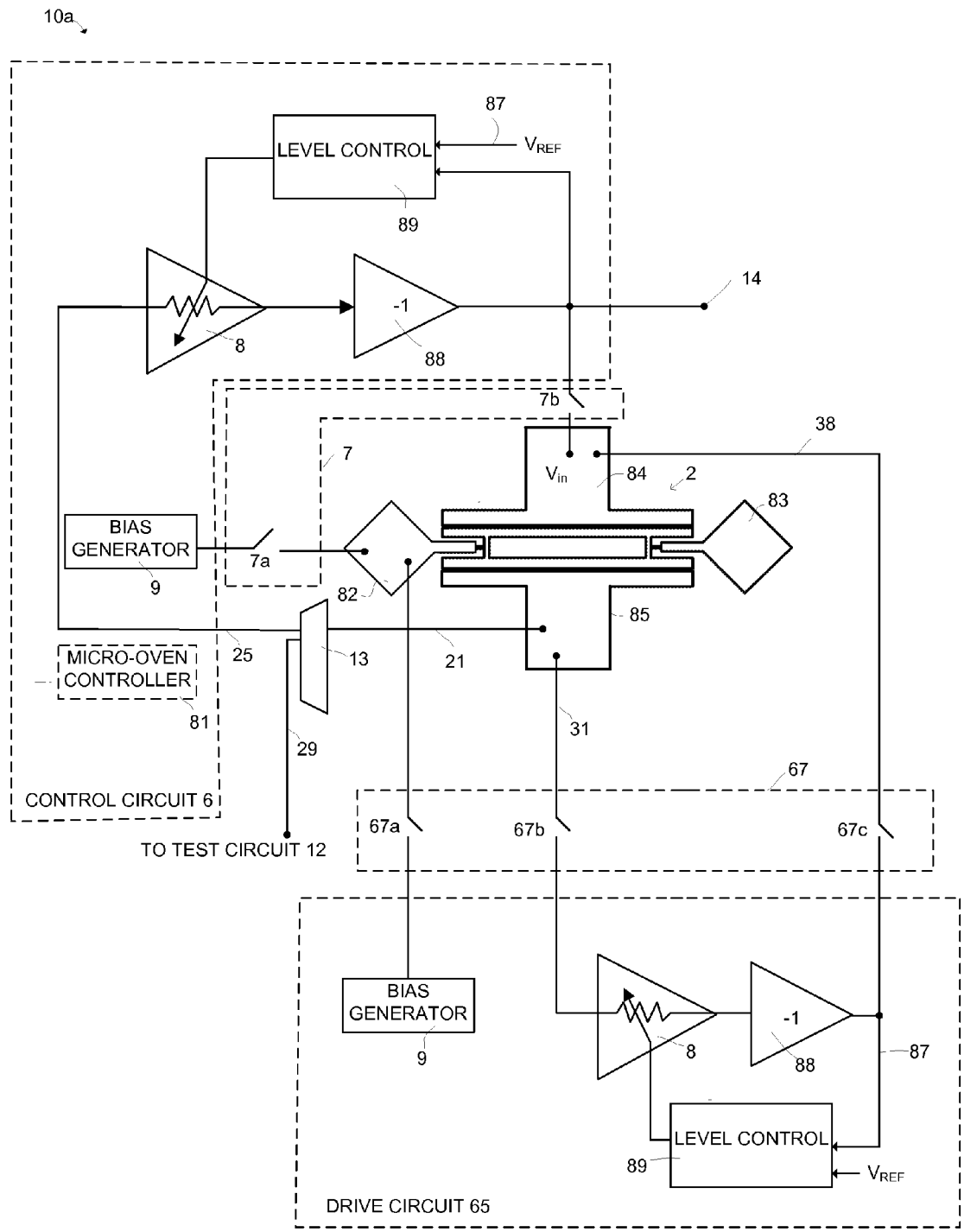
FIG. 8 is a block diagram of a control circuit and portions of a test circuit that are coupled to an exemplary MEMS resonator, in accordance with an embodiment of the present invention.

Switches 7a, 67 and 13 can be any type of switch or switch circuit as are known in the art for performing the indicated switching function and can include one or more individual switch. In one embodiment that is illustrated in FIG. 8, switch 7 includes a first switch 7a and a second switch 7b for selectively connecting the circuitry of drive circuit 11 to MEMS resonator 2. Though only one MEMS resonator 2 is shown in FIG. 8, it is appreciated that each of the other MEMS resonators in array of MEMS resonators 1 are coupled in the same manner.

Referring still to FIG. 8, drive circuit 11 includes level control circuit 89 that limits oscillation amplitude to values smaller than the distortion limit set by amplifier 8. Level control circuit 89 is coupled to receive a reference voltage ($V_{REF}$) 87, and is electrically coupled to the input 84 of MEMS resonator 2, to amplifier 8 and to the output of inverting buffer 88.

The output of amplifier 8 is electrically coupled to inverting buffer 88. In one embodiment amplifier 8 is a CMOS trans-impedance based amplifier with a self-biased folded-cascode OTA core. In the present embodiment, the gain of amplifier 8 is varied with a voltage controlled MOS resistor to minimize resonator saturation due to large drive amplitudes. In this embodiment drive circuit 11 includes bias generator 9 that generates a bias voltage for operating MEMS resonator 2.

In the present embodiment bias generator 9 is a charge pump based biasing circuit that biases MEMS resonator 2 with a voltage in the range of 25 Volts. In one embodiment bias generator 9 is a parabolic temperature compensating bias generator that compensates for temperature variation. Control circuit 6 also includes an optional micro-oven controller 81 for heating each of MEMS resonators 2-5. In one specific embodiment level control circuit 89, amplifier 8, micro-oven controller 81 and inverting buffer 88 are formed in the same manner as shown in the reference titled "Temperature Compensated CMOS and MEMS-CMOS Oscillators for Clock Generators and Frequency References," by Krishnakumar Sundaresan, Georgia Institute of Technology, December 2006, which is incorporated herein by reference in its entirety.

In the embodiment shown in FIG. 8, at step 101 test circuit 12 closes switches 7a-7b. This couples drive circuit 11 to MEMS resonator 2 such that the output of bias generator 9 is applied to pad 82 of MEMS resonator 2, and such that an AC input voltage Vin is applied to input 84, initiating oscillation of MEMS resonator 2. Test circuit 12 provides input to switch 13 such that the output of switch 13 is provide only to output 29, coupling the output of MEMS resonator 2 to test circuit 12. Since the output of switch 13 is not provided to line 25, the output of MEMS resonator 2 will not be coupled to output 14 of the clock generator.

When MEMS resonator 2 is the selected MEMS resonator (in step 104) test circuit 12 provides input to switch 13 such that the output of the selected MEMS resonator at line 21 is provided both to line 25 and line 29, coupling the output of selected MEMS resonator 2 to output 14 of the clock generator and to test circuit 12.

Continuing with FIG. 8, during the operation of the selected MEMS resonator, the input voltage $V_{in}$ to the selected MEMS resonator is generated by level control circuit 89, amplifier 8, inverting buffer 88, and is not a specific predetermined test voltage $V_T$ as is used in step 101. Moreover, the bias voltage $V_{BIAS}$ may not be the same, resulting in variations in test output and test data. Also, temperature variations may affect the test data. Accordingly the test data and/or the test criteria in step 105 may be different from the test data and test criteria used in step 102. In one embodiment tolerances $L_T$, $R_T$ and $C_T$ for step 105 are set at different levels than the tolerances of step 102.

Figure 9:
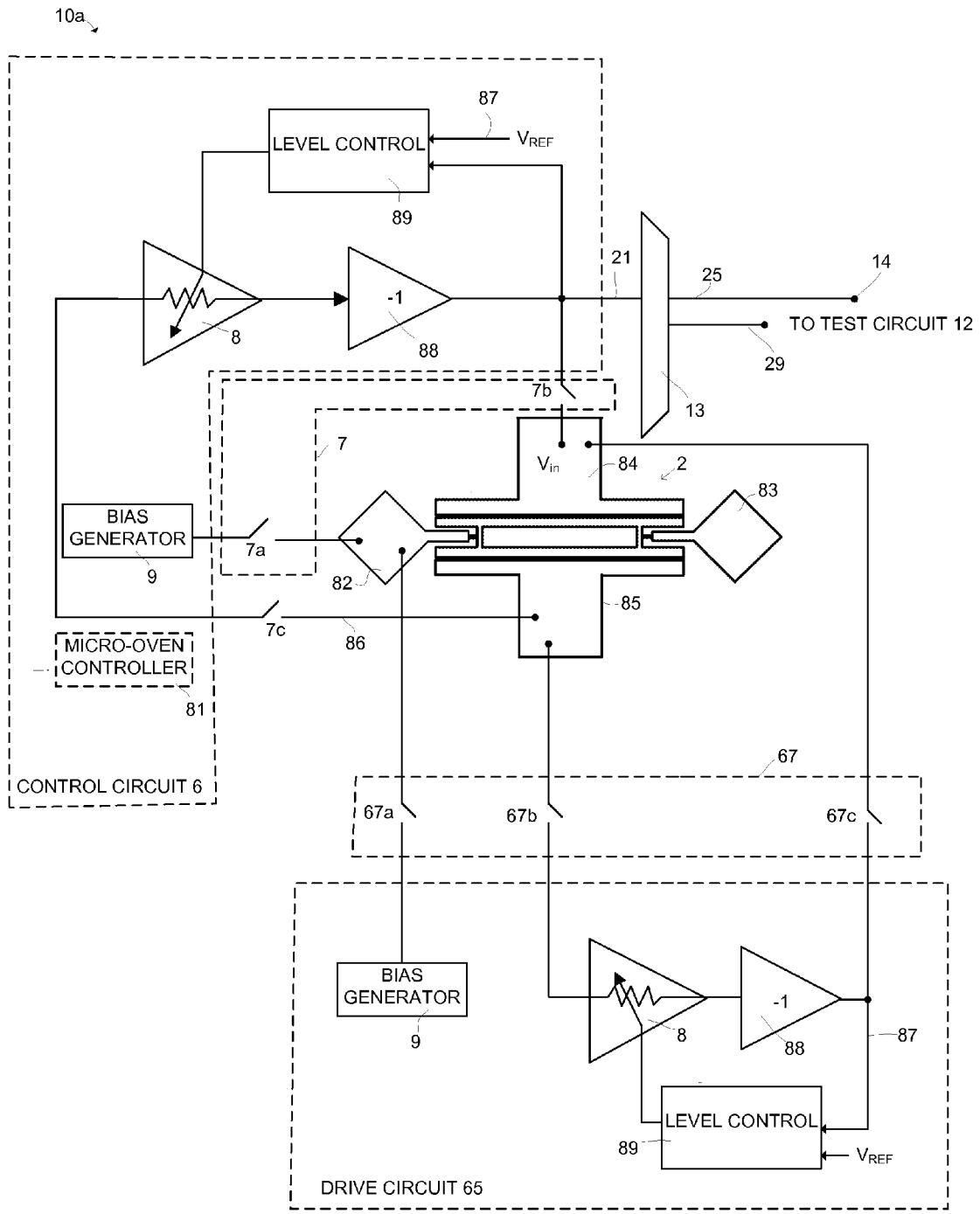
FIG. 9 is a block diagram of a control circuit and portions of a test circuit that are coupled to an exemplary MEMS resonator, in accordance with an embodiment of the present invention.

Clock generator 10-10a in FIGS. 1, 3 and 8 show amplifier 8 and feedback loop 25 to be positioned between switch 13 and the output 14 of the clock generator. Alternatively, amplifier 8 can be positioned in front of switch 13 such that the output clock signal is applied to the input of switch 13. FIG. 9 shows an exemplary embodiment in which MEMS resonator 10a includes an amplifier 8 positioned such that it amplifies the output prior to coupling the output to switch 13. Control circuit 6 includes switches 7a-7c that couple control circuit 6 to MEMS resonator 2 and includes switch 13 that is connected to the output of inverting buffer 88. One output of switch 13 connects to output 14 and the other output of switch 13 connects to test circuit 12. In this embodiment, at step 101 test circuit 12 provides input to control circuit 6 to close switches 7a-7c. This couples drive circuit 11 to MEMS resonator 2 such that the output of bias generator 9 is applied to pad 82 of MEMS resonator 2 and such that an AC input voltage $V_{in}$ is applied to input 84, initiating oscillation of MEMS resonator 2. Test circuit 12 provides input to switch 13 such that the output of switch 13 is provide only to output 29, coupling the output of MEMS resonator 2 to test circuit 12. Since the output of switch 13 is not provided to line 25, the output of MEMS resonator 2 will not be coupled to output 14 of the clock generator. When MEMS resonator 2 is the selected MEMS resonator (in step 104) test circuit 12 provides input to switch 13 such that the output of the selected MEMS resonator at line 21 is provided both to line 25 and line 29, coupling the output of selected MEMS resonator 2 to output 14 of the clock generator and to test circuit 12.

In FIGS. 8-9 test circuit 12 includes a bias generator 9, an amplifier 8, an inverting buffer 88 and a level control circuit 89 for driving MEMS resonator 2. In this embodiment switch 67 includes individual switches 67a-67c for coupling the components of drive circuit 65 to MEMS resonator 2. It is appreciated that the other MEMS resonators in array of MEMS resonators 1 will be coupled in the same manner.

Clock generator 10a in FIGS. 8-9 is shown to include a bias generator 9 and test circuit 12 is shown to include a second bias generator 9. It is appreciated that, when MEMS resonators 2-5 are piezoelectric resonators, bias generator 9 is not required as no bias current is necessary. Moreover, switches 7a and 67c are not required. In one specific embodiment MEMS resonators 2-5 are piezoelectric resonators and drive circuit 6 includes circuitry for driving the piezoelectric MEMS resonators. The piezoelectric MEMS resonators can be any type of piezoelectric MEMS resonator, and can be a piezoelectric resonator such as is disclosed in U.S. Pat. No. 6,909,221 by Farrokh Ayazi et al., and titled "PIEZOELECTRIC ON SEMICONDUCTOR-ON-INSULATOR MICROELECTROMECHANICAL RESONATORS" which is incorporated herein by reference in its entirety.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for assuring reliability of a clock generator that includes an array of MEMS resonators comprising:
   operating a plurality of MEMS resonators in the array of MEMS resonators at start-up of the clock generator to generate a test output from each of the plurality of MEMS resonators;
   analyzing the test output of the plurality of MEMS resonators to determine which of the plurality of operated MEMS resonators meet a test criteria;
   selecting a MEMS resonator from the plurality of operated MEMS resonators that meets the test criteria and coupling an output of the selected MEMS resonator that meets the test criteria to an output of the clock generator to generate an output clock signal;
   repeatedly analyzing the output of the selected MEMS resonator to determine whether the output of the selected MEMS resonator continues to meet the test criteria;
   replacing the selected MEMS resonator with a replacement MEMS resonator when the output of the selected MEMS resonator no longer meets the test criteria by selecting the replacement MEMS resonator from the non-selected MEMS resonators that were determined to meet the test criteria, operating the replacement MEMS resonator, and coupling the output of the replacement MEMS resonator to the output of the clock generator.

2. The method of claim 1 further comprising:
   during the operation of the selected MEMS resonator, operating one or more of the non-selected MEMS resonators to generate additional test output; and
   analyzing the additional test output during operation of the selected MEMS resonator to determine which of the non-selected MEMS resonators are generating additional test output that meets the test criteria.

3. The method of claim 2 wherein analyzing the additional test output comprises storing test data in memory storage and analyzing the stored test data.

4. The method of claim 1 wherein all of the MEMS resonators in the array of MEMS resonators are operated and analyzed prior to coupling the output from the selected MEMS resonator to the output of the clock generator.

5. The method of claim 1 wherein selecting a replacement MEMS resonator from the non-selected MEMS resonators that were determined to meet the test criteria further comprises synchronizing the replacement MEMS resonator with the selected MEMS resonator prior to coupling the output from the replacement MEMS resonator to the output of the clock generator.

6. The method of claim 1 wherein analyzing the test output further comprises determining whether an inductance of the selected MEMS resonator is within an inductance tolerance.

7. The method of claim 1 wherein analyzing the test output further comprises determining whether a capacitance of the selected MEMS resonator is within a capacitance tolerance.

8. The method of claim 1 wherein the analyzing the test output further comprises determining whether an impedance of the selected MEMS resonator is within an impedance tolerance.

9. The method of claim 1 further comprising:
during the operation of the selected MEMS resonator and only during idle cycles of a component of an integrated circuit device that is utilizing the output clock signal generated by the clock generator, operating one or more of the non-selected MEMS resonators to generate additional test output; and
analyzing the additional test output during operation of the selected MEMS resonator to determine which of the non-selected MEMS resonators are generating output that meets the test criteria.

10. A method for assuring reliability of a clock signal comprising:
operating a selected MEMS resonator to generate output that is coupled to the output of a clock generator;
operating one or more non-selected MEMS resonators to generate test output during operation of the selected MEMS resonator;
analyzing the test output from the non-selected MEMS resonators during operation of the selected MEMS resonator to determine which of the non-selected MEMS resonators are generating output that meets a test criteria;
repeatedly analyzing the output from the selected MEMS resonator during operation of the selected MEMS resonator to determine whether the output of the selected MEMS resonator continues to meet the test criteria; and
replacing the selected MEMS resonator with a replacement MEMS resonator if the selected MEMS resonator no longer meets the test criteria by selecting the replacement MEMS resonator from the non-selected MEMS resonators that were determined to meet the test criteria, operating the replacement MEMS resonator, and coupling the output of the replacement MEMS resonator to the output of the clock generator.

11. The method of claim 10 further comprising:
operating one or more MEMS resonators in an array of MEMS resonators at start-up of the clock generator to generate test output from each of the operated MEMS resonators;

analyzing the test output generated during start-up by each of the operated MEMS resonators to determine whether the operated MEMS resonators meet a test criteria; and
when one or more of the operated MEMS resonators meets the test criteria, selecting one of the operated MEMS resonators that meets the test criteria coupling the output from the selected MEMS resonator to the output of the clock generator for generating an output clock signal.

12. The method of claim 10 wherein the analyzing the test output further comprises determining whether an inductance of the operated MEMS resonator is within an inductance tolerance, determining whether a capacitance of the operated MEMS resonator is within a capacitance tolerance, and determining whether an impedance of the operated MEMS resonator is within an impedance tolerance.

13. The method of claim 10 wherein some of the test output is generated by performing voltage margin testing, and further comprising storing the test results from the voltage margin testing in persistent data storage.

14. The method of claim 10 wherein some of the test output is provided by applying a plurality of different bias voltage levels to each operated MEMS resonator and determining a temperature and a frequency of each of the operated MEMS resonators and further comprising storing each of the plurality of different bias voltage levels applied, the determined temperature, and the determined frequency in persistent data storage.

15. A clock generator comprising:
an array of MEMS resonators formed on an integrated circuit die;
a control circuit that is electrically coupled to each of the MEMS resonators in the array of MEMS resonators, the control circuit including a first drive circuit for operating the MEMS resonators in the array of MEMS resonators;
a switch electrically coupled to the control circuit, the output of each MEMS resonator coupled to an input of the switch and an output of the switch electrically coupled to an output of the clock generator; and
a test circuit electrically coupled to the control circuit and to the switch, the test circuit operable at start-up to operate one or more of the MEMS resonators to generate a test output, to analyze the test output to determine whether the one or more operated MEMS resonators meets a test criteria, to select an operated MEMS resonator that meets the test criteria and to control the operation of the switch so as to couple the output from the selected MEMS resonator to the output of the clock generator for generating an output clock signal, the test circuit operable after start-up to repeatedly analyze the output of the selected MEMS resonator to determine if the output of the selected MEMS resonator continues to meet the test criteria and if the output of the selected MEMS resonator no longer meets the test criteria, to replace the selected MEMS resonator with a replacement MEMS resonator, the replacement MEMS resonator selected from the non-selected MEMS resonators that meet the test criteria and to control the operation of the switch so as to couple the output from the replacement MEMS resonator to the output of the clock generator.

16. The clock generator of claim 15 wherein the test circuit includes a second drive circuit that can be coupled to each of the MEMS resonators, the test circuit operable to couple the output of the second drive circuit to non-selected MEMS resonators for generating additional test output while the first drive circuit operates the selected MEMS resonator coupled to the output of the clock generator, the test circuit further operable to analyze the additional test output to determine non-selected MEMS resonators that meet the test criteria.

17. The clock generator of claim 16 wherein the second drive circuit includes a second bias generator that can be coupled to each of the MEMS resonators.

18. The clock generator of claim 17 wherein the test circuit includes an idle cycle detect circuit for detecting idle cycles, the test circuit only coupling the output of the second bias generator to non-selected MEMS resonators for generating additional test output during idle cycles.

19. The clock generator of claim 16 wherein the test criteria comprises determining whether an inductance of the operated MEMS resonator is within an inductance tolerance, determining whether a capacitance of the operated MEMS resonator is within a capacitance tolerance, and determining whether an impedance of the operated MEMS resonator is within an impedance tolerance.

20. The clock generator of claim 15 wherein the first drive circuit includes a first bias generator and wherein the control circuit includes an amplifier, the output of the switch electrically coupled to the amplifier.

* * * * *